United States Patent [19]
Sun et al.

[11] Patent Number: 6,064,947
[45] Date of Patent: May 16, 2000

[54] TIME BASE GENERATOR INTERNAL VOLTAGE-CONTROLLED OSCILLATOR CALIBRATION SYSTEM AND METHOD

[75] Inventors: Bo Sun, Irvine; Kirby Lam, Rancho Santa Margarita; Rodney Masumoto, Tustin, all of Calif.

[73] Assignee: Texas Instruments Incorporated, Dallas, Tex.

[21] Appl. No.: 08/917,816

[22] Filed: Aug. 27, 1997

[51] Int. Cl.[7] .............................. H03B 5/00; H03L 7/099
[52] U.S. Cl. ...................... 702/106; 369/44.32; 331/187
[58] Field of Search ........................... 702/106; 331/1 R, 331/18, 177 R, 187; 369/44.32; 455/180.3

[56] References Cited

U.S. PATENT DOCUMENTS

| | | | |
|---|---|---|---|
| 4,780,866 | 10/1988 | Syracuse | 369/59 |
| 5,065,413 | 11/1991 | Fukuda | 375/120 |
| 5,166,641 | 11/1992 | Davis et al. | 331/1 A |
| 5,295,128 | 3/1994 | Hutchins et al. | 369/59 |
| 5,334,952 | 8/1994 | Maddy et al. | 331/1 A |
| 5,382,922 | 1/1995 | Gersbach et al. | 331/1 A |
| 5,414,390 | 5/1995 | Kovacs et al. | 331/2 |
| 5,461,642 | 10/1995 | Hutchins et al. | 375/327 |
| 5,604,465 | 2/1997 | Farabaugh | 331/10 |
| 5,726,607 | 3/1998 | Brede et al. | 331/2 |
| 5,731,723 | 3/1998 | Chen | 327/157 |
| 5,739,727 | 4/1998 | Lofter et al. | 331/11 |
| 5,870,001 | 2/1999 | Osterling et al. | 331/11 |

*Primary Examiner*—Patrick Assouad
*Attorney, Agent, or Firm*—W. Daniel Swayze, Jr.; Wade James Brady, III; Frederick J. Telecky, Jr.

[57] ABSTRACT

A successive approximation system and method for calibrating an oscillator in a time base generator application. An oscillator output frequency is compared to a reference frequency. Control logic calibrates an input control current to the oscillator, one bit at a time, through a digital-to-analog converter. The calibrated input control current corrects central frequency errors in the oscillator. Successive approximation continues until all bits are tested.

15 Claims, 3 Drawing Sheets

TIME BASE GENERATOR INTERNAL VOLTAGE-CONTROLLED OSCILLATOR CALIBRATION SYSTEM AND METHOD

BACKGROUND OF THE INVENTION

The invention relates to an improved system and method for voltage-controlled oscillator (VCO) calibration in a phase-locked loop (PLL) for time base generator applications. In particular, the invention calibrates a VCO center frequency to a reference frequency in a dynamic integrated circuit environment.

VCO circuits are well known in the art and are typically used in applications where a stable, controllable, high frequency signal is required. For example, a VCO may be used as part of a PLL in a frequency synthesizer to provide high frequency clock signals. PLLs use phase to lock on to a signal to generate synchronous clocking of digital signals. In a typical application, these clock signals may be applied to the clock inputs of integrated circuit chips in a particular system to synchronize their operations.

It is well known in the art of integrated circuit design to use fuses (low resistance, e.g. 200Ω, connections in an unblown state) in conjunction with other circuit elements to adjust circuit operating parameters, such as voltage or current gain. See e.g., U.S. Pat. No. 5,412,594. By selectively blowing fuses, circuits may be "trimmed" after manufacture to accommodate desired parameters. When blown, fuses become high resistance elements (e.g., 10 KΩ to 20 MΩ), thus isolating other elements or sections from the rest of the circuit. In particular, fuse trimming circuits have traditionally been used to reduce the overall center frequency error in VCO circuits due to post-manufacture non-ideal circuit and process variations.

Such prior art fuse trimming circuits inherently have several disadvantages, however. First, the fuse trimming method increases production costs. Because it is necessary to physically contact the fuse with a probe in order to blow it, fuse trimming typically occurs as part of wafer probe during the manufacturing process. In the case of VCO adjustment, frequency measurements will also have to be performed during wafer probe as part of the fuse trimming method. Also, additional test time will be required to achieve accuracy in high frequency measurements.

Second, because fuse trimming is an irreversible, one-time process, the trimmed circuit is limited to a particular data rate and nominal conditions. Data rate changes occur, for example, when a computer system changes zones on a disk drive. As the head of the disk drive moves from the outer zone of the disk to the inner zone, the data rate slows down. Data rate changes and other dynamic characteristics, must therefore fall within limited tolerances allowed by the specifications of the trimmed circuit, because it will be difficult or impossible to further adjust the circuit after wafer probe has been completed.

Moreover, many applications pack these integrated circuits in plastic or other encapsulation materials. Such packaging may vary circuit parameters after trimming has occurred. While reverse trimming methods have been developed in an effort to counter these problems, such methods do not always resolve satisfactorily many inherent circuit inconsistencies.

Third, fuses that are blown or marginally-blown exhibit varying resistance characteristics from chip to chip. In addition, marginally-blown fuses may exhibit lower resistivity as a result of regrowth. VCO circuits are sensitive to "open" fuse resistance, which typically varies from 10 KΩ to 20 MΩ. Such broad variation in resistivity limits a designer's flexibility when designing compatible circuits.

Finally, given the uncertainty of blown or marginally-blown fuses, circuit reliability problems exist.

SUMMARY OF THE INVENTION

The invention overcomes the limitations associated with conventional voltage-controlled oscillator (VCO) calibration methods and systems. The invention teaches the use of a feedback loop to approximate a VCO calibration current with a corresponding digital code. Thus, the invention eliminates the need to probe or conduct additional frequency testing during the chip fabrication process. Therefore, the complexity and cost of chip fabrication are substantially reduced.

Similarly, the invention does not suffer from the irreversible, one-time fuse trimming process that fixes the characteristics of the circuit. The invention adjusts for dynamic circuit conditions that cause deviations between the frequency of the output of the VCO and a desired frequency, independent of the cause of the deviation.

In one aspect, the invention teaches a method for calibrating a VCO to a reference frequency in a phase-locked loop (PLL) including the steps of: providing a digital signal with a leading bit asserted and all remaining bits of the digital signal nonasserted; converting the digital signal into an analog signal; receiving a control current; adding the analog signal to the control current; receiving a sum of the analog signal and the control current within the oscillator; adjusting an oscillator frequency in accordance with the sum; detecting an oscillator output signal; detecting a reference frequency signal; comparing the oscillator output signal to the reference frequency signal; leaving the leading bit asserted if the oscillator output signal lags the reference frequency signal; deasserting the leading bit if the oscillator output signal leads the reference frequency signal; and repeating the steps above for each remaining bit in the digital signal.

The invention uses a dynamically changing circuit that adapts to changes in data rate, temperature, power supply, aging, or any other frequency-altering characteristic. For example, variance in circuit parameters due to plastic packaging is eliminated as the circuit encounters the variance. The invention detects a difference in phase, which can occur for whatever reason, and adjusts accordingly. For example, data rate changes, variations in temperature and power supply, and/or packaging effects are compensated for each time the present invention calibrates the VCO.

In addition, the present invention eliminates the costly process of blowing or marginally-blowing fuses in order to achieve desired circuit parameters. Thus, the invention avoids the varying resistance characteristics of the fuse trimming method.

Finally, the present invention allows the chip designer to design the chip independent of the dynamic circuit characteristics mentioned above. This adds flexibility and reliability when designing compatible circuits. The chip area required to implement a calibration circuit according the present invention is currently understood to be about the same as that required for the fuse trimming method described above. Thus, integration into silicon of the subject calibration circuit does not present any disadvantages relative to currently known techniques.

DETAILED DESCRIPTION

A presently preferred embodiment of the invention will now be explained in terms of the aforedescribed drawings and the following description.

Figure 1:
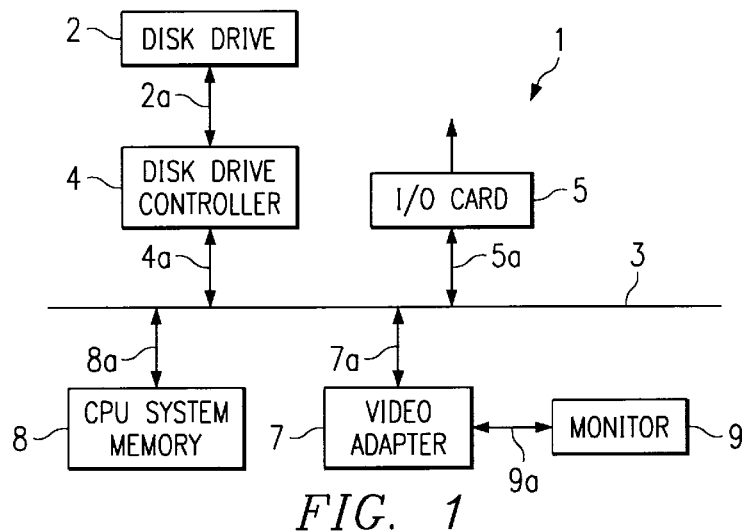
FIG. 1 is a block diagram of a computer system that adjusts to the dynamically varying circuit parameters of its disk drive.

FIG. 1 is a block diagram of a computer system 1, which includes a disk drive 2 that adjusts to dynamic circuit or data rate parameters. Disk drive 2 is connected to a disk drive controller 4 by line 2a. Disk drive controller 4 connects to a bus 3 by line 4a. An I/O card 5, a video adapter 7, and a CPU and system memory 8 are also connected to bus 3 via lines 5a, 7a, and 8a, respectively. In addition, a monitor 9 couples to bus 3 via lines 7a and 9a and video adapter 7. Use of I/O card 5, video adapter 7, CPU and system memory 8, monitor 9, and their interconnections in a computer system in this manner is well known by those skilled in the relevant art.

Figure 2:
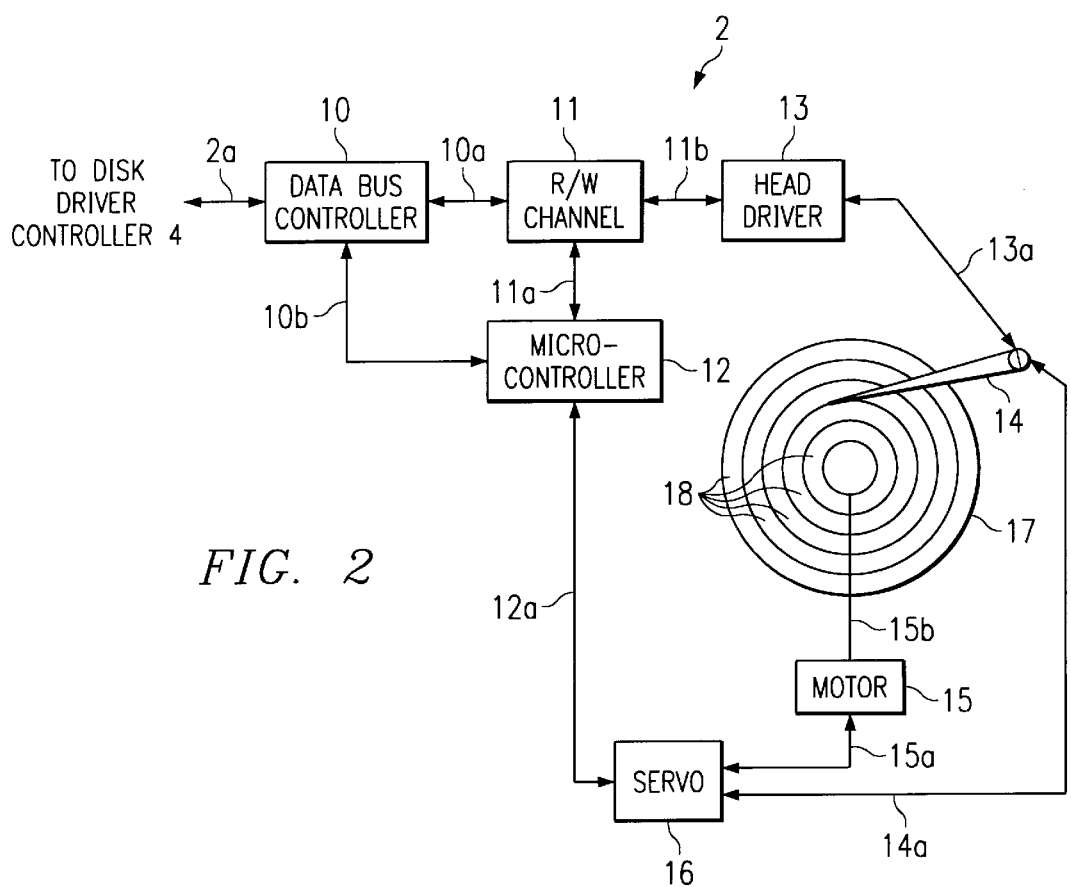
FIG. 2 is a block diagram of a disk drive.

FIG. 2 is a block diagram of disk drive 2. A data bus controller 10 interfaces disk drive 2 with disk drive controller 4. Data bus controller 10 also connects to a read/write channel 11 and to a microcontroller 12 via lines 10a and 10b, respectively. Data bus controllers are commonly used to interface disk drives to computer systems. Read/write channel 11 is further coupled to a microcontroller 12 and to a head driver 13 via lines 11a and 11b, respectively. Microcontrollers are also commonly used in disk drives to control the speed of the motor driving the disk. Head driver 13 connects to a head 14 by line 13a. Head 14 connects to a servo 16 via line 14a and reads/writes data from/to a disk 17. Motor 15 connects to servo 16 by line 15a and rotates disk 17 by a shaft 15b. Servo 16 connects to microcontroller 12 by line 12a. Servo 16 monitors the speed of motor 15 and the location of head 14 with respect to disk 17.

One embodiment of the present invention is a zoned recording read channel 11 for the computer system 1 shown in FIGS. 1 and 2. Channel 11 functions as follows. When reading data from a hard disk drive 2, head 14 mechanically moves over zones 18 laid out in circular regions on disk 17. The further head 14 moves toward the center of disk 17, the slower data is read from the disk. Some disks can have a broad range of data rates (e.g., 70 Mbits/s to 200 Mbits) from the innermost zone to the outermost zone, respectively. This variation in data rates can be problematic for systems that are fixed and unable to accommodate such dynamic conditions, such as with fuse trimmed circuits. The present invention as described herein accommodates for these and other dynamic circuit conditions. The present invention can be used in other systems, including but not limited to, optical disk, magnetic tape, compact disk, hard disk, floppy disk, or the like.

Head 14 reads analog pulses from disk 17, including sequences of control information, such as frequency signals. Head driver 13 amplifies these analog sequences and sends them to read/write channel 11 as serial data. Read/write channel 11 converts the serial bits of data into parallel bytes of data.

Figure 3:
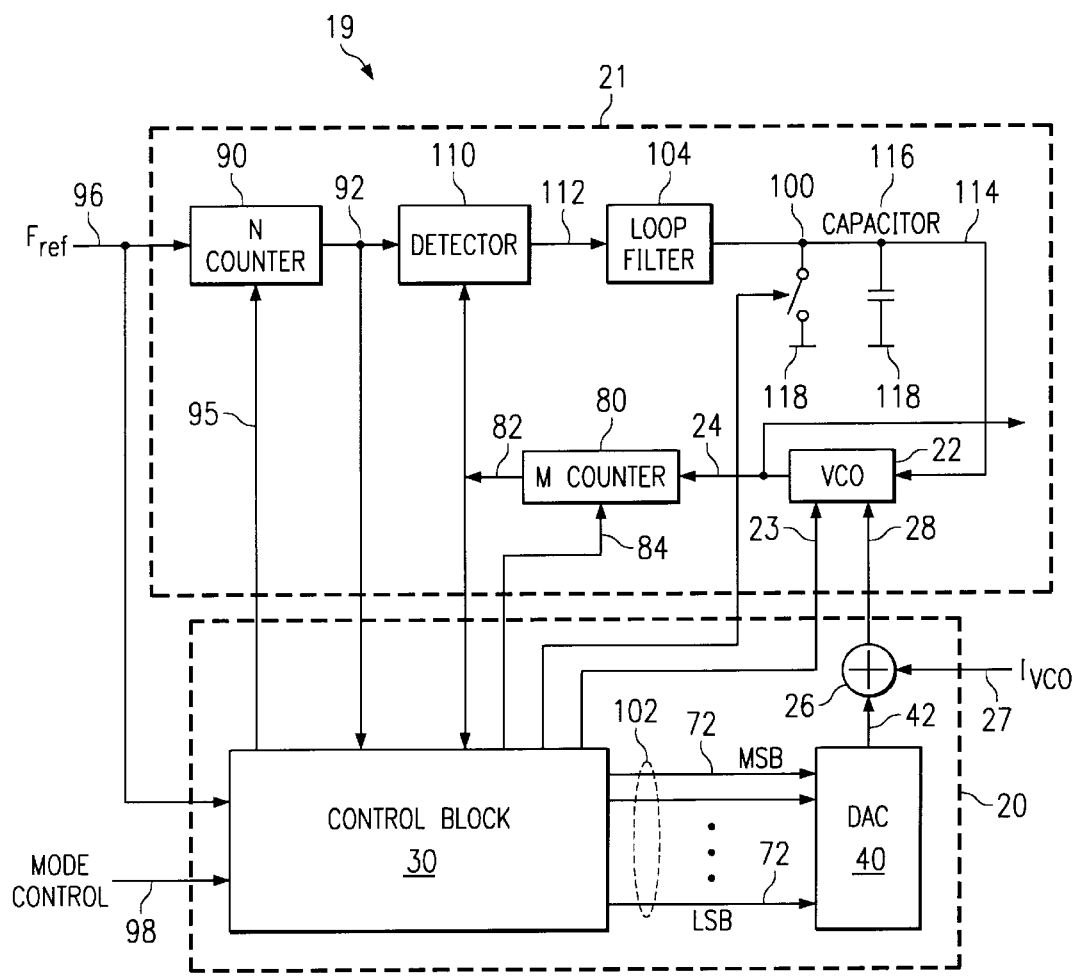
FIG. 3 is a schematic block diagram of a time base generator circuit.

Read/write channel 11 also includes a time base generator (TBG) 19 as shown in FIG. 3. A TBG 19 is a phase-locked loop (PLL) based circuit that provides a programmable reference frequency for a system. TBG 19 calibrates the frequency of head 14 using the control information provided by head 14. As the data rate changes, because of zone changes or otherwise, so does the control information. Thus, TBG 19 adapts to the dynamic characteristics of disk 17 and other circuit parameters. This calibration process is described in detail below.

Referring to FIG. 3, when in a calibration mode, the invention calibrates a VCO center frequency to a reference frequency in a dynamic integrated circuit environment. A calibration circuit 20 nulls out center frequency errors at any data rate if a subsequent calibration process is performed. In particular, calibration circuit 20 linearizes the VCO frequency characteristics for variations in frequency, power supply, temperature, and the like. This guarantees that TBG 19 will operate at its optimum state at all times, even with frequently changing circuit parameters. The present invention uses calibration circuit 20 and a phase-locked loop 21 to approximate a VCO calibration current with a corresponding digital code for TBG 19. Calibration circuit 20 includes an adder 26, a control block 30, and a digital-to-analog converter (DAC) 40.

Figure 4:
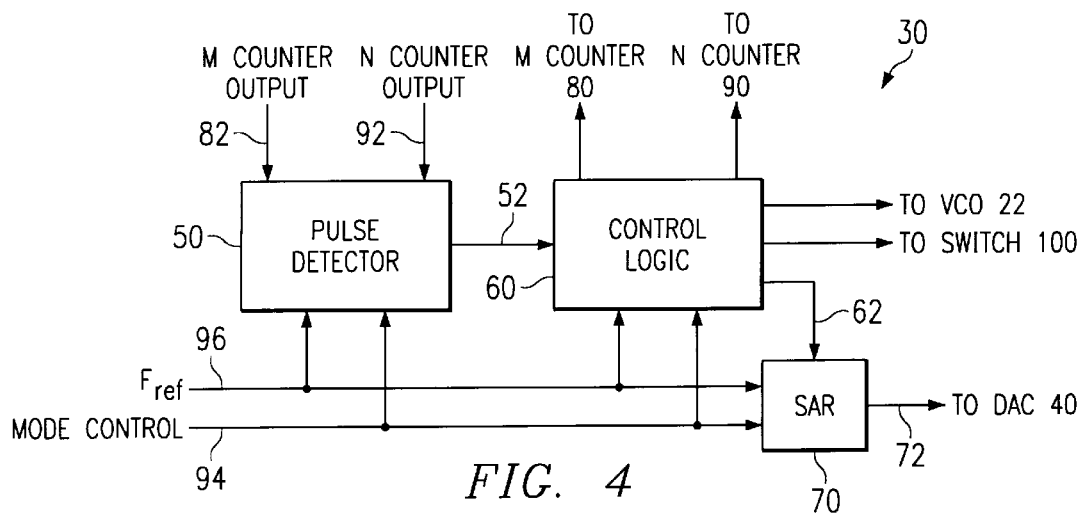
FIG. 4 is a schematic block diagram of a control block.

Referring to FIG. 4, control block 30 further includes a pulse detector 50, control logic 60, and a successive approximation register (SAR) 70. Pulse detector 50 connects to an M counter 80, an N counter 90, a mode control signal 95, and an input clock signal, $F_{ref}$ 96. In general, phase detection circuits, such as a phase detection circuit 110, are used to detect a phase difference between two signals in a PLL. In the present invention, control block 30 includes pulse detector 50 to detect whether an M counter output signal 80 or an N counter output signal 90 arrives first to control block 30. Upon detecting either signal, pulse detector 50 communicates this information, via a pulse detector output signal 52, to control logic 60.

Control logic 60 connects to VCO 22, pulse detector 50, SAR 70, M counter 80, N counter 90, mode control signal 95, $F_{ref}$ 96, and a switch 100. Control logic 60 receives pulse detector output signal 52, mode control signal 95, and $F_{ref}$ 96 and sends control signals to VCO 22 via line 23, SAR 70, M counter 80 via line 84, N counter 90 via line 94, and switch 100. Upon receiving pulse detector output signal 52, control logic 60 adjusts SAR 70 to reflect necessary changes for calibrating VCO 22. Control logic 60 and the system timing sequences are synchronized with a clock signal, $F_{ref}$ 96. In general, control logic 60 controls all sequences for calibration circuit 20. In the preferred embodiment, calibration circuit 20 provides status flags indicating whether VCO 22 can be calibrated within the assigned control range and/or whether calibration is complete.

SAR 70 connects to DAC 40, control logic 60, mode control signal 95, and $F_{ref}$ 96. SAR 70 receives three input signals (control logic output signal 62, mode control signal 95, and $F_{ref}$ 96) and sends an adjusted digital SAR output signal 72 to DAC 40. Any delay associated with SAR 70 is accounted for by adding sufficient time to allow the current to settle.

Referring again to FIG. 3, DACs are commonly used in the industry to convert digital signals to analog signals. In the preferred embodiment, DAC 40 receives the digital signal (SAR output signal 72) from SAR 70 via a parallel bit interface 102. However, as would be apparent to one skilled in the relevant art, a serial bit interface can alternatively be used. DAC 40 converts SAR output signal 72 to an analog signal (DAC output signal 42) and transmits DAC output signal 42 to an adder 26.

In general, adders (or summers) add two or more signal sequences to form a single signal sequence (the sum). In the present invention, adder 26 adds DAC output signal 42 to an input control current, $I_{VCO}$ 27, and sends the resulting sum, adder output current 28, to VCO 22. Adder output current 28 calibrates VCO 22.

It is well known by those skilled in the art to use PLLs, such as PLL 21, to lock on to the phase of a signal to ensure synchronous clocking of digital signals. By locking on to the rising or falling edge of a first digital signal, PLLs are able to synchronize the phase of a second signal with that of the first signal. PLL 21 includes a voltage-controlled oscillator (VCO) 22, an M counter 80, an N counter 90, a phase detection circuit 110, and a loop filter 104.

In the industry, VCOs, or voltage-to-frequency converters, are currently used in a wide variety of applications, including communication or control systems. While the invention as described herein refers to a voltage-controlled oscillator, a current-controlled oscillator could alternatively be utilized.

VCO 22 receives signals from adder 26, control logic 60, loop filter 104, and switch 100 and sends a VCO output signal 24 to M counter 80. VCO output signal 24 is also the output signal for TBG 19. The frequency of VCO output signal 24 is $F_{ref} \times M/N$, where M/N is the ratio of the programmed number of counts of M counter 80 and N counter 90. For example, if $F_{ref}$ is 25 Mhz, M pulses every 10 counts, and N counter 90 pulses every five counts, then the frequency of VCO output signal 24 is 50 Mhz. Typically, a read channel for a hard disk drive, as described in the example above, operates from 70 Mhz to 200 Mhz. By programming M and N counters 80, 90, a designer may achieve additional desired output frequencies.

In the present invention, M and N counters 80, 90 are sequential binary counters. However, various types of counters that are well known in the art could be used. M counter 80 receives signals from VCO 22 and control logic 60 and sends M counter output signal 82 to pulse detector 50 and phase detection circuit 110. N counter 90 receives signals from $F_{ref}$ 96 and control logic 60 and sends N counter output 92 to pulse detector 50 and phase detection circuit 110.

In normal operational mode (not in a calibration mode), phase detection circuit 110 detects whether M counter output signal 82 leads or lags N counter output 92 and asserts a corresponding up/down signal 112. For example, if N counter output 92 leads M counter output signal 82, then VCO 22 is running too slowly. In this case, phase detection circuit 110 adjusts VCO 22 by asserting an up voltage signal 112 to loop filter 104. If N counter output 92 lags M counter output signal 82, then VCO 22 is running too fast, and phase detection circuit 110 adjusts VCO 22 by asserting a down signal 112.

Loop filter 104 is a passive circuit including a resistor (not shown) and a capacitor 116, however, any low-pass filter can be utilized, including an active low-pass filter. Capacitor 116 holds the loop filter output voltage when the system is in normal operational mode. Loop filter 104 only functions in normal operational mode. Upon switching to a calibration mode, loop filter 104 shorts to ground reference 118.

By implementing calibration functions, such as performed by calibration circuit 20, TBG 19 linearizes the VCO frequency characteristics, thus minimizing the adjustments to VCO 22. Moreover, the user enjoys increased design flexibility by determining when the circuit will enter a particular calibration mode by selecting one of three choices on an external control (not shown).

Mode control signal 95 is an input bit that enables or disables the calibration function depending upon the user's mode selection. For example, the user may select any one of three calibration settings: a) perform a one-time calibration process after power-up, b) perform a calibration process for every data rate change (e.g., zone change as discussed above), or c) perform a calibration process at any time specified by the user (e.g., whenever temperature changes occur or before each read or write of data).

The present invention allows the user to determine the necessary calibration accuracy for the user's particular system. For example, the calibration process in the present invention includes several calibration steps or cycles. If a user desires a system with 7-bit precision, then a 7-bit SAR is used and seven calibration cycles are required to complete the calibration process. However, where more or less precision is desired, an SAR with a different number of bits could alternatively be utilized. The accuracy of calibration circuit 20 depends upon the number of bits in SAR 70 and the delay matching between programmable M and N counters 80, 90, which are manageable design factors.

Figure 5:
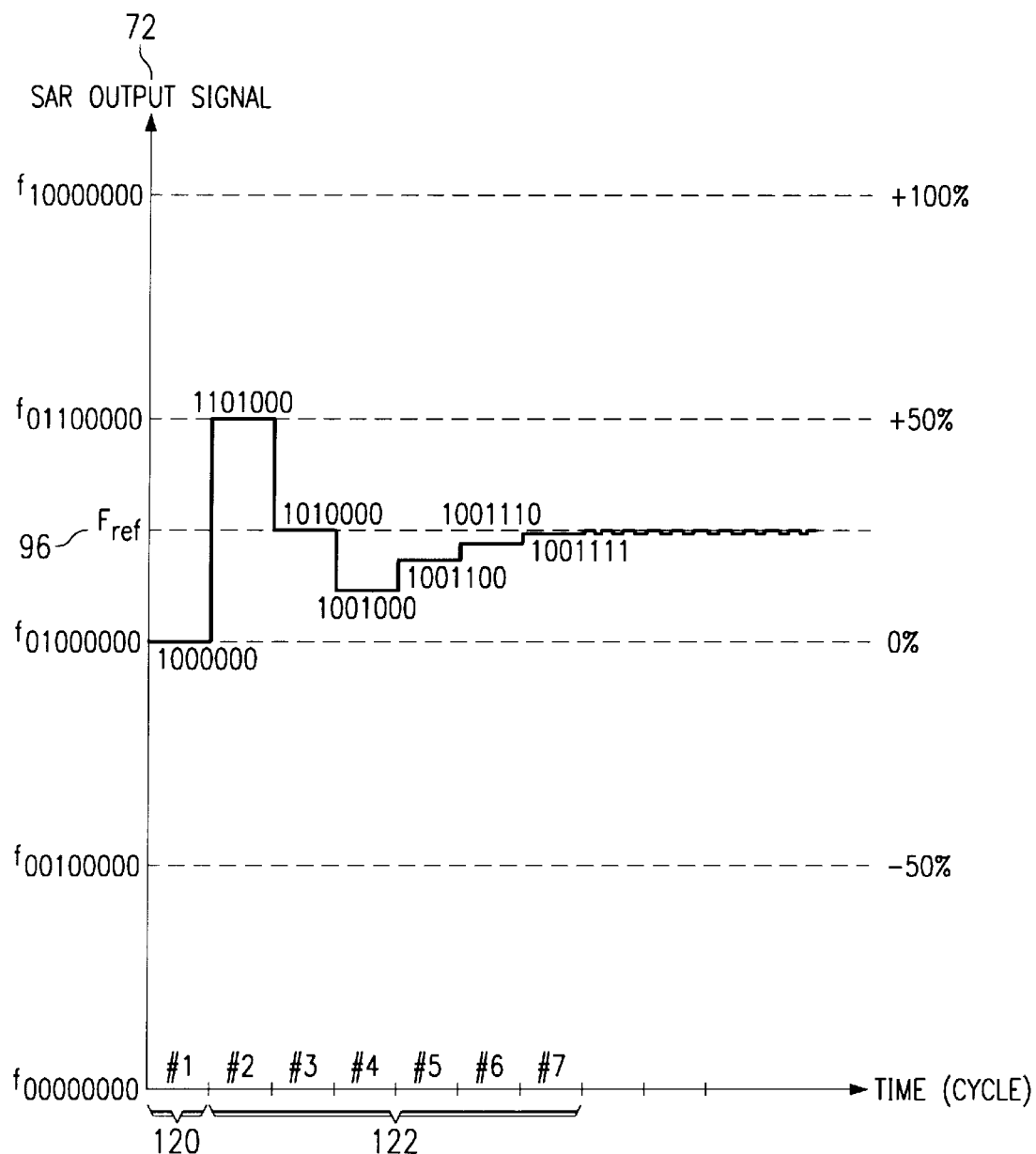
FIG. 5 illustrates a comparison of the output signals from the successive approximation register to a desired VCO center frequency.

FIG. 5 shows how the calibration process functions with respect to a particular example of seven calibration cycles. For a first calibration cycle 120, control logic 60 produces a logic "1" as a trial bit for the most significant bit (MSB) in SAR 70 and sets the remaining bits at logic "0." SAR 70 sends this digital signal 72 to DAC 40 via parallel bit interface 102. DAC 40 converts digital signal 72 to an analog signal 42 and transmits signal 42 to adder 26. Adder 26 adds analog signal 42 to input control current, $I_{VCO}$ 27, and sends the resulting sum, adder output current 28, to VCO 22. Adder output current 28 then adjusts the oscillation frequency of VCO 22. Control logic 60 then shuts VCO 22 down. This completes the first cycle.

Each subsequent cycle 120 in the calibration process begins by control logic 60 resetting VCO 22, M counter 80, and N counter 90. Control logic 60 synchronizes a simultaneous start time between VCO 22, counter 80, and N counter 90. This start time begins when pulse detector 50 detects the rising edges of M and N counter outputs 82, 92. VCO 22, M counter 80, and N counter 90 use $F_{ref}$ 96 to synchronize a concurrent starting time.

In each subsequent cycle, pulse detector 50 determines which output goes high first, then sends this information to control logic 60. For example, if N counter output 92 leads M counter output signal 82, then VCO 22 is running too slowly. In this case, control logic 60 adjusts SAR 70 by maintaining a "1" for the MSB of SAR 70. If N counter output 92 lags M counter output signal 82, then VCO 22 is running too fast, and control logic 60 inserts a "0" for the MSB and each of the remaining bits.

In either case, control logic 60 also inserts a "1" for the second most significant bit. Similar to the first cycle, the second set of bits is sent to SAR 70, DAC 40, Adder 26, and VCO 22. VCO 22 and Counters 80, 90 are then reset and pulse detector 50 again detects whether M counter output signal 82 leads or lags N counter output 92. If the rising edge of M counter output signal 82 lags the rising edge of N counter output 92, the "1" is retained, otherwise it is replaced with a "0." It should be well understood in the relevant art that these steps can be triggered on the falling edges or the like. This approximation process continues until all bits, from the most significant bit to the least significant bit, are tested in successive cycles. Once the calibration process is completed, switch 100 switches back to allow PLL 21 to operate.

The total time required to complete the entire calibration process depends upon the mode chosen by the user, $F_{ref}$ 96, the N value, and the number of bits in SAR 70. The total time required for calibration is $B \times (N+C)/F_{ref}$, where B is the number of bits in SAR 70, N is the number of programmed counts in N counter, and C is the number of $F_{ref}$ cycles needed to perform the logic function.

Having described the invention in detail, those skilled in the art will appreciate that various modifications may be made of the invention without departing from its spirit. Therefore, it is not intended that the scope of this invention be limited to the specific embodiments illustrated and described herein. Rather, it is intended that the scope of the invention be determined by the appended claims and their equivalents.

We claim:

1. A system for optimizing data access in a dynamic circuit parameter environment comprising:
    a processor;
    a memory device, wherein said memory device is coupled to said processor and wherein said memory device includes a channel; and
    a time base generator coupled to said channel for calibrating a frequency within said channel to a reference frequency set by a user.

2. A system for optimizing data access as claimed in claim 1, wherein said channel is a zoned recording read channel.

3. A system for optimizing data access as claimed in claim 1, wherein said channel is a zoned recording write channel.

4. A system for optimizing data access as claimed in claim 1, wherein said memory device is a disk drive.

5. A system for optimizing data access as claimed in claim 4, wherein said disk drive is an optical disk drive.

6. A system for optimizing data access as claimed in claim 4, wherein said disk drive is a hard disk drive.

7. A system for optimizing data access as claimed in claim 1, wherein said memory device is a magnetic tape drive.

8. A system for optimizing data access as claimed in claim 1, wherein said frequency within said channel fluctuates.

9. A circuit for calibrating an oscillator frequency to a reference frequency in a time base generator application comprising:
    a control block including a first input terminal for receiving an oscillator signal, a second input terminal for receiving a reference signal set by a user, a signal detector for detecting a first arrival of either said oscillator signal or said reference signal at said control block, and control logic for providing a digital signal corresponding to said first arrival;
    a digital-to-analog converter (DAC) interfaced with said control block, wherein said DAC receives said digital signal and converts said digital signal into an analog signal;
    an adder coupled to said DAC, wherein said adder includes a first input terminal for receiving said analog signal and a second input terminal for receiving a control current and wherein said adder adds said analog signal to said control current, thereby producing a summed signal; and
    an oscillator connected to said adder, wherein said oscillator receives said summed signal and wherein said summed signal adjusts a center frequency of said oscillator.

10. A circuit for calibrating an oscillator as claimed in claim 9, wherein said oscillator is a voltage-controlled oscillator.

11. A circuit for calibrating an oscillator frequency to a reference frequency in a time base generator application comprising:
    a control block including a first input terminal for receiving an oscillator signal, a second input terminal for receiving a reference signal, a signal detector for detecting a first arrival of either said oscillator signal or said reference signal at said control block, and control logic for providing a digital signal corresponding to said first arrival;
    a digital-to-analog converter (DAC) interfaced with said control block, wherein said DAC receives said digital signal and converts said digital signal into an analog signal;
    an adder coupled to said DAC, wherein said adder includes a first input terminal for receiving said analog signal and a second input terminal for receiving a control current and wherein said adder adds said analog signal to said control current, thereby producing a summed signal; and
    an oscillator connected to said adder, wherein said oscillator receives said summed signal and wherein said summed signal adjusts a center frequency of said oscillator,
    wherein said oscillator is a current-controlled oscillator.

12. A circuit for calibrating an oscillator frequency to a reference frequency in a time base generator application comprising:
    a control block including a first input terminal for receiving an oscillator signal, a second input terminal for receiving a reference signal, a signal detector for detecting a first arrival of either said oscillator signal or said reference signal at said control block, and control logic for providing a digital signal corresponding to said first arrival;
    a digital-to-analog converter (DAC) interfaced with said control block, wherein said DAC receives said digital signal and converts said digital signal into an analog signal;
    an adder coupled to said DAC, wherein said adder includes a first input terminal for receiving said analog signal and a second input terminal for receiving a control current and wherein said adder adds said analog signal to said control current, thereby producing a summed signal; and
    an oscillator connected to said adder, wherein said oscillator receives said summed signal and wherein said summed signal adjusts a center frequency of said oscillator,
    wherein said control block further includes a sequential approximation register for sequentially adjusting one bit of said digital signal each time said signal detector detects said first arrival, until all bits in said digital signal have been adjusted.

13. A circuit for calibrating an oscillator frequency to a reference frequency in a time base generator application comprising:
    a control block including a first input terminal for receiving an oscillator signal, a second input terminal for receiving a reference signal, a signal detector for detecting a first arrival of either said oscillator signal or said reference signal at said control block, and control logic for providing a digital signal corresponding to said first arrival;
    a digital-to-analog converter (DAC) interfaced with said control block, wherein said DAC receives said digital signal and converts said digital signal into an analog signal;

an adder coupled to said DAC, wherein said adder includes a first input terminal for receiving said analog signal and a second input terminal for receiving a control current and wherein said adder adds said analog signal to said control current, thereby producing a summed signal; and an oscillator connected to said adder, wherein said oscillator receives said summed signal and wherein said summed signal adjusts a center frequency of said oscillator, wherein said sequential approximation register first adjusts the most significant bit of said digital signal.

14. A method for calibrating an oscillator to a reference frequency in a time base generator, wherein said steps include:

enabling detection of an oscillator signal;

enabling detection of a reference signal set by a user;

detecting a first occurrence of either said oscillator signal or said reference signal at a control block;

providing a digital signal that corresponds to said first occurrence;

converting said digital signal into an analog signal;

receiving a control current;

adding said analog signal to said control current, thereby producing a summed signal; and adjusting an oscillator frequency in accordance with said sum.

15. A method for calibrating an oscillator to a reference frequency in a time base generator, wherein said steps include:

enabling detection of an oscillator signal;

enabling detection of a reference signal;

detecting a first occurrence of either said oscillator signal or said reference signal at a control block;

providing a digital signal that corresponds to said first occurrence;

converting said digital signal into an analog signal;

receiving a control current;

adding said analog signal to said control current, thereby producing a summed signal;

adjusting an oscillator frequency in accordance with said sum;

asserting a leading bit in said digital signal and deasserting all remaining bits in a first cycle;

maintaining said leading bit asserted if said oscillator signal lags said reference signal and deasserting said leading bit if said oscillator signal leads said reference signal;

providing a subsequent cycle for each of said remaining bits in said digital signal, wherein each subsequent leading bit of said remaining bits in asserted and all subsequent remaining bits remain deasserted; and maintaining said leading remaining bit asserted if said oscillator signal lags said reference signal and deasserting said leading remaining bit if said oscillator signal leads said reference signal.

* * * * *